United States Patent
Lee et al.

(10) Patent No.: US 9,595,572 B2
(45) Date of Patent: Mar. 14, 2017

(54) THIN FILM ENCAPSULATION UNIT, ORGANIC LIGHT EMITTING DIODE DISPLAY INCLUDING THE SAME AND MANUFACTURING METHOD THEREOF

(71) Applicant: Samsung Display Co., Ltd., Yongin-si, Gyeonggi-do (KR)

(72) Inventors: Byoung-Duk Lee, Yongin-si (KR); Yun-Ah Chung, Yongin-si (KR); Yoon-Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/954,946

(22) Filed: Nov. 30, 2015

(65) Prior Publication Data

US 2016/0093682 A1 Mar. 31, 2016

Related U.S. Application Data

(62) Division of application No. 13/915,517, filed on Jun. 11, 2013, now Pat. No. 9,203,049.

(30) Foreign Application Priority Data

Sep. 14, 2012 (KR) ........................ 10-2012-0102383

(51) Int. Cl.
*H01L 29/08* (2006.01)
*H01L 29/04* (2006.01)
*H01L 27/14* (2006.01)
*H01L 27/15* (2006.01)
*H01L 27/32* (2006.01)
(Continued)

(52) U.S. Cl.
CPC ...... *H01L 27/3258* (2013.01); *H01L 27/3246* (2013.01); *H01L 27/3248* (2013.01); *H01L 27/3272* (2013.01); *H01L 51/5253* (2013.01); *H01L 51/5256* (2013.01); *H01L 51/5281* (2013.01); *H01L 51/5284* (2013.01); *H01L 51/56* (2013.01); *H01L 2227/323* (2013.01); (Continued)

(58) Field of Classification Search
CPC ............. H01L 27/3258; H01L 27/3246; H01L 27/3248; H01L 27/3272; H01L 51/5256; H01L 51/5281; H01L 51/5284; H01L 51/56
USPC ........................................ 257/40, 59, 72, 79
See application file for complete search history.

(56) References Cited

U.S. PATENT DOCUMENTS

2002/0053871 A1*  5/2002  Seo ..................... H01L 51/5012
                                                                   313/504
2003/0184219 A1  10/2003  Duggal et al.
(Continued)

FOREIGN PATENT DOCUMENTS

KR  10-2004-0100915 A  12/2004
KR  10-2006-0070166 A   6/2006
(Continued)

OTHER PUBLICATIONS

U.S. Office Action dated Oct. 26, 2016, for cross reference U.S Appl. No. 14/954,941 (12 pages).

*Primary Examiner* — Dzung Tran
(74) *Attorney, Agent, or Firm* — Lewis Roca Rothgerber Christie LLP

(57) ABSTRACT

A thin film encapsulation unit including an inorganic layer, a first organic layer on the inorganic layer and including a light-blocking unit and a light-transmitting unit, and a reflection-preventing layer on the first organic layer.

11 Claims, 11 Drawing Sheets

(51) Int. Cl.
  *H01L 51/52* (2006.01)
  *H01L 51/56* (2006.01)
(52) U.S. Cl.
  CPC .. *H01L 2251/301* (2013.01); *H01L 2251/303* (2013.01)

(56) References Cited

U.S. PATENT DOCUMENTS

| | | |
|---|---|---|
| 2004/0124770 A1 | 7/2004 | Hayashi et al. |
| 2005/0048224 A1* | 3/2005 | Araya .................. C09B 1/005 428/1.3 |
| 2005/0110404 A1* | 5/2005 | Park ..................... H01L 51/56 313/512 |
| 2005/0116637 A1 | 6/2005 | Yoshizawa |
| 2007/0040489 A1 | 2/2007 | Ray et al. |
| 2007/0049155 A1 | 3/2007 | Moro et al. |
| 2007/0132381 A1* | 6/2007 | Hayashi .............. H01L 51/5253 313/512 |
| 2007/0273280 A1 | 11/2007 | Kim et al. |
| 2008/0018230 A1 | 1/2008 | Yamada et al. |
| 2008/0218064 A1 | 9/2008 | Cho et al. |
| 2008/0305360 A1* | 12/2008 | Han .................... H01L 51/5256 428/690 |
| 2009/0153042 A1 | 6/2009 | Izumi et al. |
| 2010/0019654 A1 | 1/2010 | Hayashi |
| 2011/0140164 A1 | 6/2011 | Seo et al. |
| 2012/0133275 A1 | 5/2012 | Lee et al. |
| 2012/0280612 A1 | 11/2012 | Lee et al. |

FOREIGN PATENT DOCUMENTS

| | | |
|---|---|---|
| KR | 10-0829750 B1 | 5/2008 |
| KR | 10-2012-0043497 A | 5/2012 |

* cited by examiner

1004

THIN FILM ENCAPSULATION UNIT, ORGANIC LIGHT EMITTING DIODE DISPLAY INCLUDING THE SAME AND MANUFACTURING METHOD THEREOF

CROSS-REFERENCE TO RELATED APPLICATION

This application is a divisional of U.S. patent application Ser. No. 13/915,517, filed Jun. 11, 2013, which claims priority to and the benefit of Korean Patent Application No. 10-2012-0102383, filed Sep. 14, 2012, the entire content of both of which is incorporated herein by reference.

BACKGROUND

1. Field

The described technology relates generally to an organic light emitting diode (OLED) display.

2. Description of the Related Art

An organic light emitting diode display includes organic light emitting elements that include a hole injection electrode, an organic emission layer, and an electron injection electrode. Each organic light emitting element emits light by energy generated when excitons that are generated by combining electrons and holes in the organic emission layer fall from an exited state to a bottom state/ground state, and the organic light emitting diode display displays images by using this light emission.

Because the organic light emitting diode display has the characteristic of self-luminance, and therefore, unlike a liquid crystal display, a separate light source is not required, and thickness and weight of the organic light emitting diode display may be reduced. Further, because the organic light emitting diode display exhibits high quality characteristics such as low power consumption, high luminance, and rapid response speed, the organic light emitting diode display receives attention as a next generation display device.

Such an OLED display extracts generated light by resonance, while reflection in a thin film transistor, a capacitor, a driver, and a signal line in a non-light-emission area causes deterioration of contrast.

Thus, a circular polarizer film is used to improve contrast. The circular polarizer film includes a linear polarizer film and a phase difference film according to a method for bonding multiple films. Such a circular polarizer film is attached after deposition of a thin film encapsulation of a display panel. However, because the circular polarizer film may be as thick as 200 µm, the display device cannot be as slim, and production cost is increased.

The above information disclosed in this Background section is only for enhancement of understanding of the background of the described technology, and may therefore contain information that does not form the prior art that is already known in this country to a person of ordinary skill in the art.

SUMMARY

Embodiments of the present invention provide an OLED display that can improve contrast without using a circular polarizer film, can be formed slim, and can reduce production cost, and a method for manufacturing the OLED display.

A thin film encapsulation unit according to an exemplary embodiment includes an inorganic layer, a first organic layer on the inorganic layer and including a light-blocking unit and a light-transmitting unit, and a reflection-preventing layer on the first organic layer.

The thin film encapsulation unit may further include a second organic layer including a transparent material on the inorganic layer.

The thin film encapsulation unit may further include a plurality of second organic layers and a plurality of inorganic layers, wherein the second organic layers and the inorganic layers are iteratively layered.

The thin film encapsulation unit may further include a plurality of first organic layers and a plurality of inorganic layers, wherein the inorganic layers and the first organic layers are alternately layered.

The light-blocking unit may include an organic material including a black pigment.

The reflection-preventing layer may include a metal layer and a dielectric material layer.

Transmittance of the reflection-preventing layer may be about 30% to about 70%.

The metal layer may include at least one of chromium (Cr), molybdenum (Mo), titanium (Ti), tungsten (W), or an alloy thereof.

The dielectric material layer may include a high-refractive index layer and a low-refractive index layer, wherein the high-refractive index layer includes a material having a refractive index of about 1.6 or higher, and wherein the low-refractive index layer includes a material having a refractive index of less than about 1.6.

The reflection-preventing layer may include a first chromium layer, a first silicon oxide layer, a second chromium layer, a titanium oxide layer, and a second silicon oxide layer.

An OLED display according to the present invention includes a substrate on which an organic light emitting element is located, an inorganic layer and an organic layer on the substrate and covering the organic light emitting element, and a reflection-preventing layer on the organic layer, wherein the organic layer includes a light-blocking unit and a light-transmitting unit.

The substrate may include a light-emission area where the organic light emitting element is located, and a non-light-emission area including an area other than the light-emission area, wherein the light-blocking unit of the organic layer corresponds to the non-light-emission area, and wherein the light-transmitting unit corresponds to the light-emission area.

The organic light emitting element may include a first electrode, an organic emission layer, and a second electrode, and the light-emission area may correspond to the organic emission layer.

The OLED display may further include a plurality of inorganic layers and a plurality of organic layers, wherein the inorganic layers and the organic layers are alternately layered.

The organic layer may further include a transparent organic layer including a transparent organic material.

The reflection-preventing layer may include a metal layer and a dielectric material layer.

Transmittance of the reflection-preventing layer may be about 30% to about 70%.

The metal layer may include at least one of chromium (Cr), molybdenum (Mo), titanium (Ti), tungsten (W), or an alloy thereof.

The dielectric material layer may include a high refractive index layer and a low refractive index layer, wherein the high refractive index layer includes a material having a refractive index of about 1.6 or higher, and wherein the low refractive index layer includes a material having a refractive index of less than about 1.6.

The reflection-preventing layer may include a first chromium layer, a first silicon oxide layer, a second chromium layer, a titanium oxide layer, and a second silicon oxide layer.

The OLED display may further include a transistor on the substrate, an interlayer insulating layer on the transistor, a first electrode of the organic light emitting element on the interlayer insulating layer and coupled with the transistor through a contact hole, a pixel defining layer on the interlayer insulating layer and having an opening that exposes the first electrode, an organic emission layer of the organic light emitting element in the opening, and a second electrode of the organic light emitting element on the organic emission layer and the pixel defining layer, wherein the light-blocking unit has a plane pattern that is the same as that of the pixel defining layer.

A method for manufacturing an OLED display according to another exemplary embodiment includes forming a substrate on which an organic light emitting element is formed, forming an inorganic layer on the substrate, forming an organic layer including a light-transmitting unit and a light-blocking unit on the inorganic layer using an inkjet printing method, and forming a reflection-preventing layer on the organic layer.

The light-blocking unit may include an organic material that includes a black pigment, and the light-transmitting unit may include a transparent organic material.

The method may further include forming a transparent organic layer including a transparent organic material on the inorganic layer after forming the inorganic layer.

When the thin film encapsulation unit formed according to an exemplary embodiment of the present invention is used, contrast can be improved without using a thick polarization plate.

In addition, since the thick polarization plate is not used, the OLED display can be formed slim by reducing the thickness of the OLED display and a flexible characteristic can be improved.

DETAILED DESCRIPTION

Figure 1:
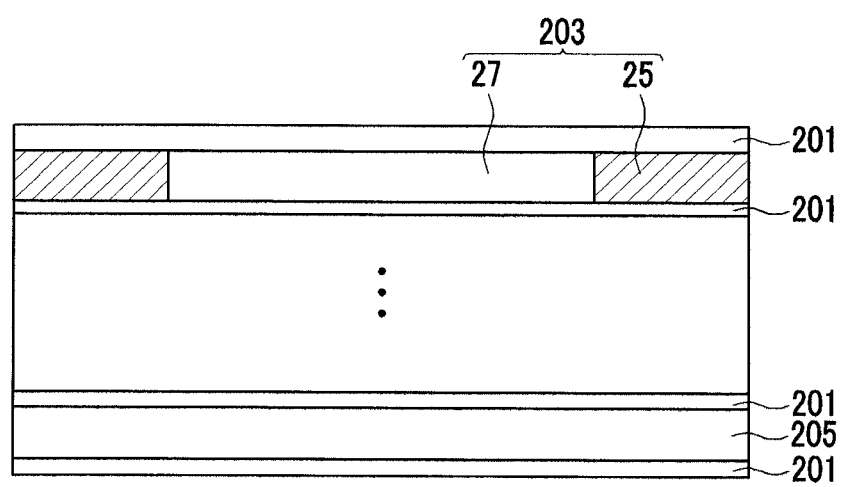
FIG. 1 is a cross-sectional view of a thin film encapsulation unit according to an exemplary embodiment of the present invention.

Embodiments of the present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In the drawings, the size and thickness of each element may be arbitrarily shown, and the present invention is not necessarily limited thereto. Further, the thickness of layers, films, panels, regions, etc., may be exaggerated for clarity, and the thickness of some of layers and regions may be exaggerated for the sake of explanation. It will be understood that when an element such as a layer, film, region, or plate is referred to as being "on" another element, it can be directly on the other element, or one or more intervening elements may also be present.

In addition, unless explicitly described to the contrary, the word "comprise" and variations thereof, such as "comprises" or "comprising," will be understood to imply the inclusion of stated elements, but not necessarily the exclusion of any other elements. Also, throughout the specification, "on" means that an element is positioned on or above another element, or under or below another element, and may not necessarily mean that an element is positioned at an upper side of the other element with respect to a direction of gravity.

Hereinafter, an organic light emitting diode (OLED) display according to an exemplary embodiment will be described with reference to the accompanying drawings.

FIG. 1 is a cross-sectional view of a thin film encapsulation unit according to an exemplary embodiment of the present invention. As shown in FIG. 1, a thin film encapsulation unit 1001 according to the exemplary embodiment includes at least one of an inorganic layer 201, a first organic layer 203, and a second organic layer 205. The thin film encapsulation unit 1001 may have a thickness of, for example, less than 10 μm.

In multi-layering, the inorganic layer 201, or multiple layers thereof, and the first organic layer 203, or multiple layers thereof, or the inorganic layer 201, or multiple layers thereof, and the second organic layer 205, or multiple layers thereof, may be alternately layered. Also, the inorganic layer 201, the first organic layer 203, and the second organic layer 205 may be alternately layered.

The inorganic layer 201 may be located between neighboring organic layers 203 and 205 among a plurality of organic layers 203 and 205, and may be the lowest/bottom-most or the highest/topmost layer of the thin film encapsulation unit 1001. The inorganic layer 201 has excellent waterproofing characteristics when compared to the organic layers 203 and 205.

The inorganic layer 201 may be a single layer or may be multilayer including at least one of aluminum oxide, such as silicon oxide (SiOx), silicon nitride (SiNx), titanium oxide (TiOx), alumina ($Al_2O_3$), and the like, and silicon oxynitride.

The first organic layer 203 and the second organic layer 205 have weaker waterproofing properties when compared to the inorganic layer 201, but have flexibility so that the first and second organic layers 203 and 205 can improve deficiencies of the organic layer 201, which is harder than the first and second organic layers 203 and 205.

The first organic layer 203 includes a light-blocking unit 25 for blocking light and a light-transmitting unit 27 for transmitting light. The light-transmitting unit 27 may be formed of a transparent light-transmissive material, for example a resin such as polyethylene terephthalate (PET), polyacrylate, polyimide (PI), and polycarbonate (PC), and the like. The light-blocking unit 25 may be formed of a material having low transmittance to absorb light, and may be formed of an organic material including a black pigment. The organic material may include, for example, an acryl resin, a silicon resin, and an epoxy resin.

The second organic layer 205 is a light-transmissive material, and may be formed of the same material of the light-transmitting unit 27 of the first organic layer 203.

The thin film encapsulation unit according to the exemplary embodiment improves contrast of the display device.

The display device including the organic light emitting element includes a display area and a non-display area. The display area is an area where an organic emission layer of the organic light emitting element is located, while the non-display area is the remaining areas of the display area.

In the present embodiment, in the display device, the light-blocking unit of the thin film encapsulation unit is located in the non-display area, and the light-transmitting unit is located in the light-emission area. Thus, the light-blocking unit reduces or eliminates light reflected by the non-light-emission area by absorbing the light, thereby improving contrast.

Figure 2:
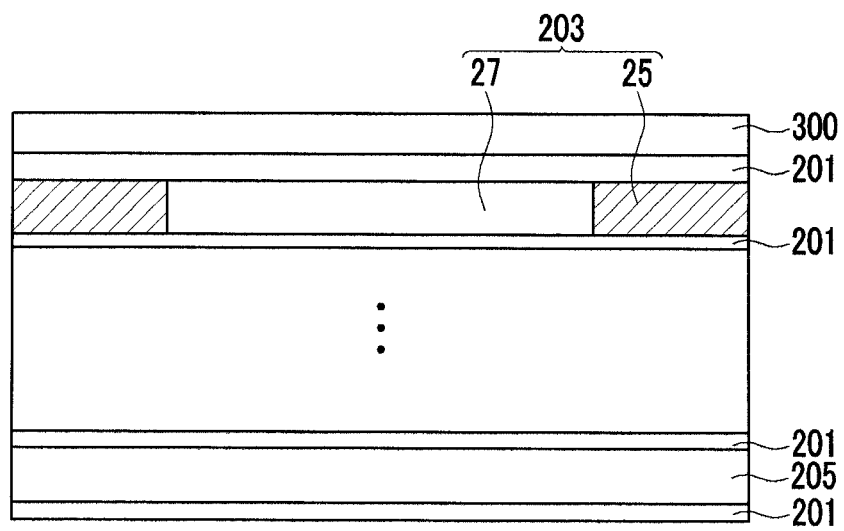
FIG. 2 to FIG. 4 are cross-sectional views of a thin film encapsulation unit according to other exemplary embodiments of the present invention.
Figure 3:
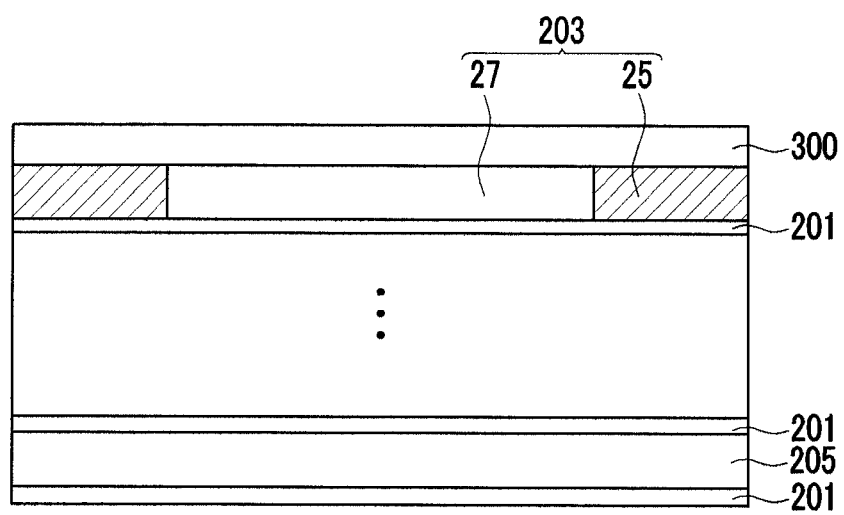
Figure 4:
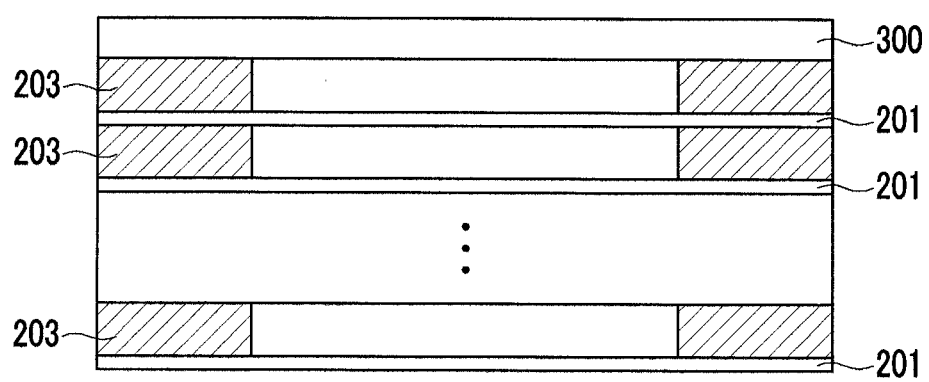

The thin film encapsulation unit may have various structures, as shown in FIG. 2 to FIG. 4. FIG. 2 to FIG. 4 are cross-sectional views of thin film encapsulation units according to other exemplary embodiments of the present invention.

As shown in FIG. 2, a thin film encapsulation unit 1002 includes at least one of an inorganic layer 201, a first organic layer 203, and a second organic layer 205. The thin film encapsulation unit 1002 is similar to the thin film encapsulation unit 1001 of FIG. 1, and therefore, only differences thereof will be described in further detail.

In FIG. 2, the thin film encapsulation unit 1002 further includes a reflection-preventing layer 300 formed on the uppermost inorganic layer 201. The reflection-preventing layer 300 includes at least one of a metal layer and a dielectric material layer, and may have a thickness of, for example, less than 1 μm. The metal layer and the dielectric material layer may be alternately layered.

The metal layer may be formed of at least one of chromium (Cr), molybdenum (Mo), titanium (Ti), tungsten (W), and an alloy thereof, and may be formed as a single layer or as a multilayer (e.g., multiple layers).

The dielectric material layer includes at least one of a high-refractive index layer and a low-refractive index layer, and the high-refractive index layer may have a refractive index of, for example, about 1.6 or higher, and may be chromium (Cr) or titanium oxide ($TiO_2$), and the low-refractive index layer may have a refractive index of, for example, lower than about 1.6, and may be $SiO_2$.

The reflection-preventing layer 300 reduces or blocks inflow of undesired external light to the display device, and allows light emitted from the organic light emitting element to be emitted to the outside, rather than being reflected. Therefore, transmittance of the reflection-preventing layer 300 may be, for example, about 30% to about 70%, and preferably about 43%.

A thin film encapsulation unit 1003 of FIG. 3 includes at least one of an inorganic layer 201, a first organic layer 203, and a second organic layer 205. The thin film encapsulation unit 1003 is similar to the thin film encapsulation unit 1002 of FIG. 2, and therefore only differences thereof will be described in further detail.

In the thin film encapsulation unit 1003 of FIG. 3, a reflection-preventing layer 300 is formed on the second organic layer 205. Thus, deterioration of contrast occurring due to reflection by the inorganic layer 201 between the reflection-preventing layer 300 and the second organic layer 205 can be prevented or reduced.

In addition, a thin film encapsulation unit 1004 of FIG. 4 includes at least one of an inorganic layer 201 and a first organic layer 203. The thin film encapsulation unit 1004 is almost the same as the thin film encapsulation unit 1001 of FIG. 1, and therefore only differences thereof will be described in further detail.

A thin film encapsulation unit 1004 of FIG. 4 can reduce or prevent deterioration of contrast due to reflection by the second organic layer 205 (see FIGS. 2 and 3) by iteratively, or alternatingly, layering the inorganic layer 201 and the first organic layer 203.

An OLED display including the thin film encapsulation unit, according to embodiments of the present invention, will be described in further detail with reference to FIG. 5 to FIG. 7.

Figure 5:
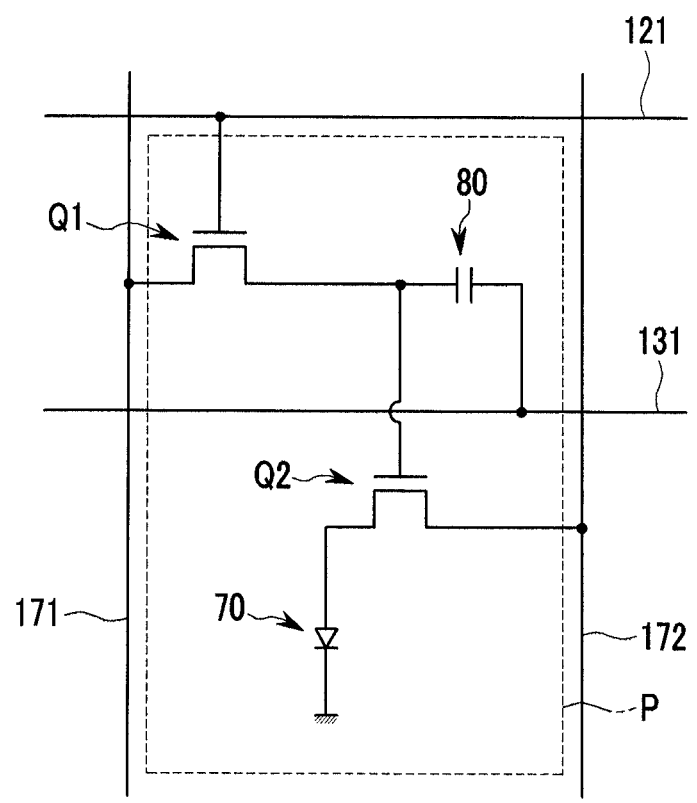
FIG. 5 is an equivalent circuit of a pixel of an organic light emitting diode (OLED) display according to an exemplary embodiment of the present invention.

FIG. 5 is an equivalent circuit diagram of a pixel of the OLED display according to an exemplary embodiment of the present invention. As shown in FIG. 5, a pixel P of the OLED display has a 2Tr-1Cap structure in which an organic light emitting diode 70, two thin film transistors (TFTs) Q1 and Q2, and one capacitor 80 are arranged. However, the exemplary embodiment is not limited thereto. Thus, in another exemplary embodiment, one pixel of the OLED display 1001 may have a structure in which three or more thin film transistors and/or two or more capacitors are arranged, and various other structures with additional wirings. The additional thin film transistor and capacitor may form a compensation circuit, which suppresses deviation in image quality by improving uniformity of operation of an organic light emitting diode 70 formed in each pixel P. In general, the compensation circuit includes 2 to 8 thin film transistors.

The organic light emitting element 70 includes an anode, which is a hole injection electrode, a cathode, which is an electron injection electrode, and an organic emission layer located between the anode and the cathode.

Each pixel P according to the present exemplary embodiment includes a first thin film transistor Q1 and a second thin film transistor Q2. The first thin film transistor Q1 and the second thin film transistor Q2 respectively include gate electrodes, semiconductors, source electrodes, and drain electrodes. In addition, a semiconductor of at least one of the first thin film transistor Q1 and the second thin film transistor Q2 includes a polysilicon layer doped with an impurity, an amorphous silicon layer, and microcrystalline silicon.

FIG. 5 illustrates a gate line 121, a data line 171, a constant voltage line 172, and a capacitor line 131, although the capacitor line 131 may be omitted as necessary or desired. The gate line 121 and the data line 171 of FIG. 5 may respectively be a first signal line and a second signal line.

The data line 171 is coupled with a source electrode of the first thin film transistor Q1, and a gate electrode of the first thin film transistor Q1 is coupled with the gate line 121. In addition, a drain electrode of the first thin film transistor Q1 is coupled to the capacitor line 131 through the capacitor 80. A node is formed between the drain electrode of the first thin film transistor Q1 and the capacitor 80, and thus a gate electrode of the second thin film transistor Q2 is coupled to the node. In addition, a source electrode of the second thin film transistor Q2 is coupled with the constant voltage line 172, and a drain electrode thereof is coupled with the anode of the organic light emitting element 70.

The first thin film transistor Q1 is used as a switch to select a pixel P for light emission. When the first thin film transistor Q1 is turned on, the capacitor 80 is charged, and the amount of charge is proportional to a voltage applied from the data line 171. In addition, when a voltage increasing signal is input for each frame cycle to the capacitor line 131 while the first thin film transistor Q1 is turned off, a gate potential of the second thin film transistor Q2 is increased in accordance with (or pursuant to) the voltage applied through the capacitor line 131. Here, the voltage has a level of a voltage applied with reference to the potential charged in the capacitor 80. The second thin film transistor Q2 is turned on when the gate potential thereof exceeds a threshold voltage of the second thin film transistor Q2. Then, a voltage applied to the constant voltage line 172 is applied to the organic light emitting element 70 through the second thin film transistor Q2 such that the organic light emitting element 70 emits light.

Figure 6:
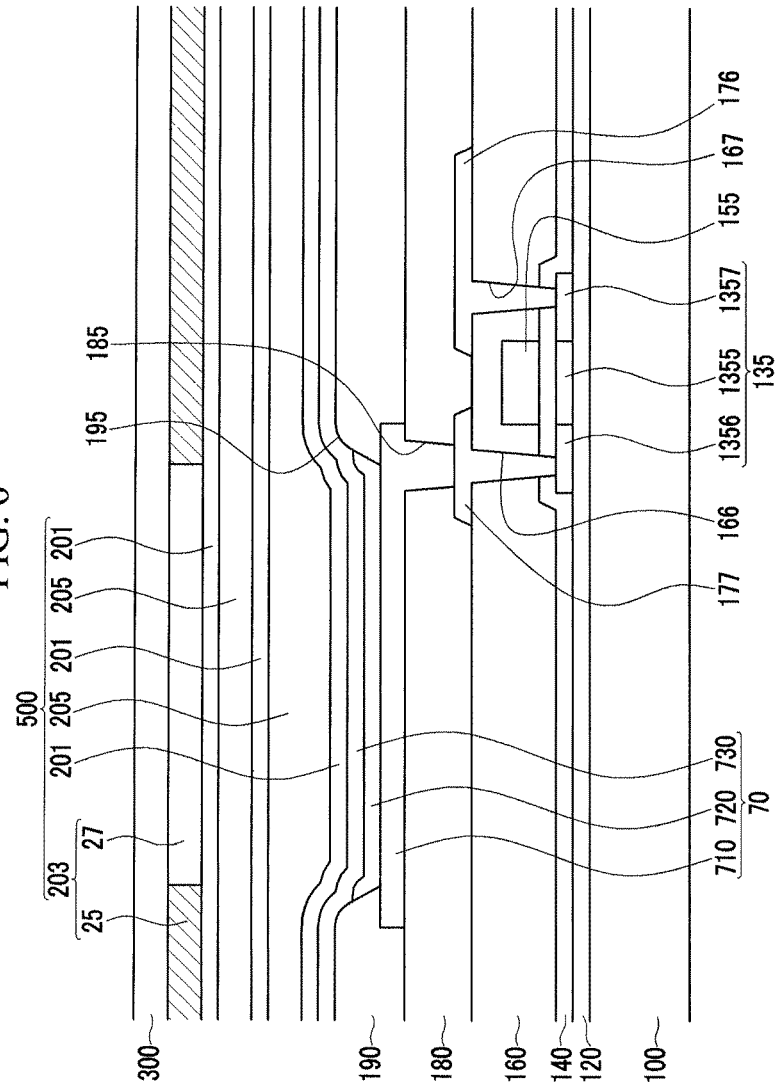
FIG. 6 is a cross-sectional view of the pixel of the OLED display of the embodiment shown in FIG. 5.
Figure 7:
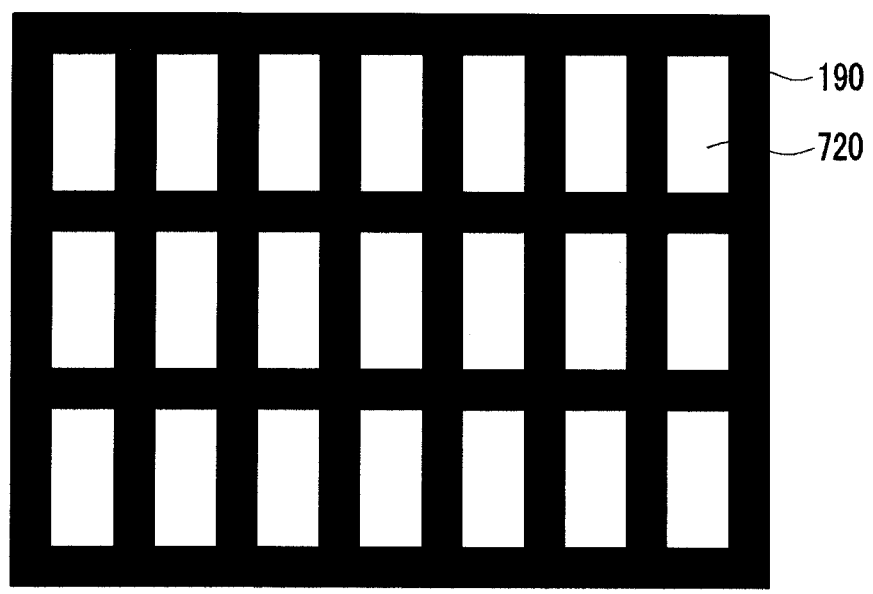
FIG. 7 is a top plan view of a pixel defining layer according to an exemplary embodiment of the present invention.

FIG. 6 is a cross-sectional view of the pixel of the OLED display of the embodiment shown in FIG. 5, and FIG. 7 is a top plan view of a pixel defining layer according to an exemplary embodiment of the present invention.

Referring to FIG. 6, a structure of the OLED display, particularly the second thin film transistor Q2 and the organic light emitting element 70 of FIG. 5, will be described in detail according to the lamination order. Hereinafter, the second thin film transistor Q2 will be referred to as a thin film transistor.

As shown in FIG. 6, a buffering layer 120 that prevents or reduces permeation of unnecessary or undesired components, such as impurities or moisture, and that also planarizes the surface, is formed on the substrate 100.

A semiconductor 135 formed of polysilicon is formed on the buffering layer 120, and is divided into a channel area 1355, a source area 1356, and a drain area 1357. The source area 1356 and the drain area 1357 are formed at respective sides of the channel area 1355, the channel area 1355 including polysilicon not doped with an impurity, that is, the channel area 1355 is an intrinsic semiconductor. The source area 1356 and the drain area 1357 of the semiconductor 135 are polysilicon doped with a conductive impurity (i.e., impurity semiconductors). The impurity doped to the source area 1356 and the drain area 1357 may be one of a p-type impurity or an n-type impurity.

A gate insulating layer 140 is formed on the semiconductor 135, and may be a single layer or multilayer including at least one of tetraethyl orthosilicate (TEOS), silicon nitride, or silicon oxide.

A gate electrode 155 is formed on the gate insulating layer 140, and overlaps the channel area 1355.

An interlayer insulating layer 60 is formed on the gate electrode 155. Like the gate insulating layer 140, the interlayer insulating layer 160 may be formed of tetraethyl orthosilicate (TEOS), silicon nitride, or silicon oxide.

The interlayer insulating layer 160 and the gate insulating layer 140 have a source contact hole 166 and a drain contact hole 167 respectively exposing the source area 1356 and the drain area 1357.

A source electrode 177 and a drain electrode 176 are formed on the interlayer insulating layer 160. The source electrode 177 is coupled with the source area 1356 through the source contact hole 166, and the drain electrode 176 is coupled with the drain area 1357 through the drain contact hole 167.

A protective layer 180 is formed on the interlayer insulating layer 160. The protective layer 180 has a contact hole 185 that exposes the drain electrode 176.

A first electrode 710 coupled with the drain electrode 176 through the contact hole 185 is formed on the protective layer 180. The first electrode 710 becomes the anode of the organic light emitting element of FIG. 5.

A pixel defining layer 190 is formed on the first electrode 710, and has an opening 195 exposing the first electrode 710. The pixel defining layer 190 may include a resin such as, for example, polyacrylates or polyimides, and an inorganic material such as silica.

An organic emission layer 720 is formed in the opening 195 of the pixel defining layer 190, and is formed as a multilayer including one or more of a light emission layer, a hole injection layer (HIL), a hole transport layer (HTL), an electron transport layer (ETL), and an electron injection layer (EIL). When the organic emission layer 720 includes all of the above, then the electron injection layer is located on the negative electrode 710, on which the electron transport layer, the organic emission layer, the hole transport layer, and the hole injection layer are then sequentially stacked.

A second electrode 730 is formed on the pixel defining layer 190 and the organic emission layer 720, and becomes the cathode of the organic light emitting element 70 of FIG. 5. Thus, the first electrode 710, the organic emission layer 720, and the second electrode 730 form the organic light emitting element 70.

The OLED display may be structured as any one of a front-display type, a rear-display type, and a single-panel dual-display type, depending upon the light-emitting direction of the organic light emitting diode 70.

If the OLED display is structured as the front-display type, the first electrode 710 is formed with a reflective film, and the second electrode 730 is formed with a semitransparent film. If the OLED display is structured as the rear-display type, the first electrode 710 is formed with a semi-transparent film, and the second electrode 730 is formed with a reflective film. If the OLED display is structured as the single-panel dual-display type, the first electrode 710 and the second electrode 730 are formed with a transparent film or a semitransparent film.

The reflective film and the semitransparent film are formed with at least one metallic material selected from magnesium (Mg), silver (Ag), gold (Au), calcium (Ca), lithium (Li), chromium (Cr), aluminum (Al), and alloys thereof. Whether a given film is a reflective film or a semitransparent film is determined depending upon the thickness thereof. With the semitransparent film, the smaller the thickness is, the more light transmittance is increased, and the more resistance is reduced.

The transparent film may be formed with, for example, indium tin oxide (ITO), indium zinc oxide (IZO), zinc oxide (ZnO), or indium oxide (In2O3).

A thin film encapsulation unit 500 is formed on the second electrode 730. In the exemplary embodiment of the present invention shown in FIG. 6, the inorganic layer 201 and the second organic layer 205 are iteratively layered twice, and then the inorganic layer 201, the first organic layer 203, and the reflection-preventing layer 300 are sequentially layered. In present exemplary embodiment, the inorganic layer 201 and the second organic layer 205 are iteratively layered. Thereafter, just the first organic layer 203 may be layered thereon, or alternatively, multiple first and second organic layers 203 and 205 may be alternately layered thereon. Furthermore, the layering may be repeated once, twice, three times, or more than three times.

In addition, the thin film encapsulation units 1001-1004 of FIG. 1 to FIG. 4 may be included.

A light-transmitting unit 27 of the thin film encapsulation unit 500 may be located in an area that corresponds to the organic emission layer 720, and a light-blocking unit 25 may be formed in areas that do not include the organic emission layer 720. As shown in FIG. 7, the light-blocking unit 27 may have the same plane pattern as the pixel defining layer 190.

As in the present exemplary embodiment, reflection of external light incident on the display device can be effectively reduced or eliminated by forming the thin film encapsulation unit 500 such that contrast of the OLED display can be improved.

That is, external light incident on the display device is reflected to various thin films included in the display device, but reduced or eliminated by being absorbed by the light-blocking unit 25 of the thin film encapsulation unit, and therefore image quality formed by light emitted from the organic light emitting element of the display can be improved by reducing or preventing deterioration due to reflection of the external light. Accordingly, the contrast of the display device can be improved.

In addition, the reflection-preventing layer 300 of the thin film encapsulation unit 500 can reduce or prevent inflow of unwanted or unnecessary external light to the display device, and can allow light emitted from the organic light emitting element to be emitted to the outside, rather than being reflected. Accordingly, reflection of the external light can be reduced, and contrast can be improved.

Figure 8:
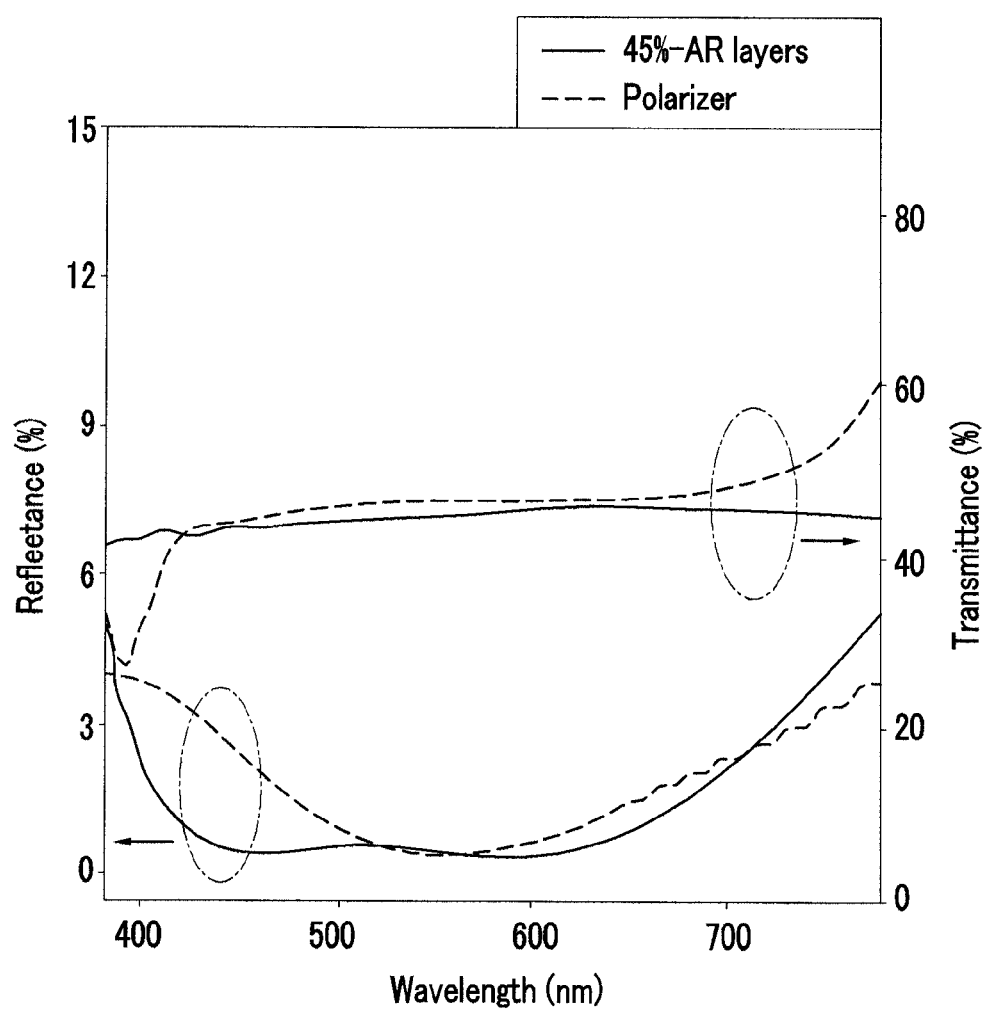
FIG. 8 is a graph measuring light efficiency characteristics of a conventional OLED display and of an OLED display according to an exemplary embodiment of the present invention.

FIG. 8 is a graph of measured light efficiency characteristics of a conventional OLED display, and of an OLED display according to an exemplary embodiment of the present invention. In the graph of FIG. 8, a conventional display device uses an encapsulation substrate formed of glass, and the display device according to the present exemplary embodiment is the OLED display of the embodiment shown in FIG. 6.

As shown in the graph of FIG. 8, transmittance of the display device according to the exemplary embodiment and transmittance of the conventional display device are similar to each other.

Table 1 shows a contrast ratio (CR) of the conventional display device and the OLED display according to the present exemplary embodiment. In Table 1, the conventional display device uses an encapsulation substrate formed of glass, and a circular polarization plate is attached onto the encapsulation substrate, while the display device according to the present exemplary embodiment is the OLED display of the embodiment shown in FIG. 6.

TABLE 1

| | Ambient light illumination (Lux) | | | | | | |
|---|---|---|---|---|---|---|---|
| | 0 | 150 | 500 | 1,000 | 5,000 | 100,000 | 200,000 |
| CR of Polarizer | 33700 | 199.3 | 43.3 | 19.0 | 4.2 | 2.5 | 1.84 |
| CR of 43% AR & BM | 32691 | 182 | 44 | 20.4 | 4.3 | 2.6 | 1.84 |

*CR: contrast ratio

As shown in Table 1, a contrast of the display device according to the exemplary embodiment is similar to a contrast of the conventional display device.

As described, when the thin film encapsulation unit is used as in the exemplary embodiment, the display device can acquire the same transmittance characteristic and the same contrast ratio without using a polarization plate having a thickness of several hundreds μm and a heavy glass encapsulation substrate. Accordingly, the thickness of the display device can be reduced, and a flexible characteristic can be improved.

Figure 9:
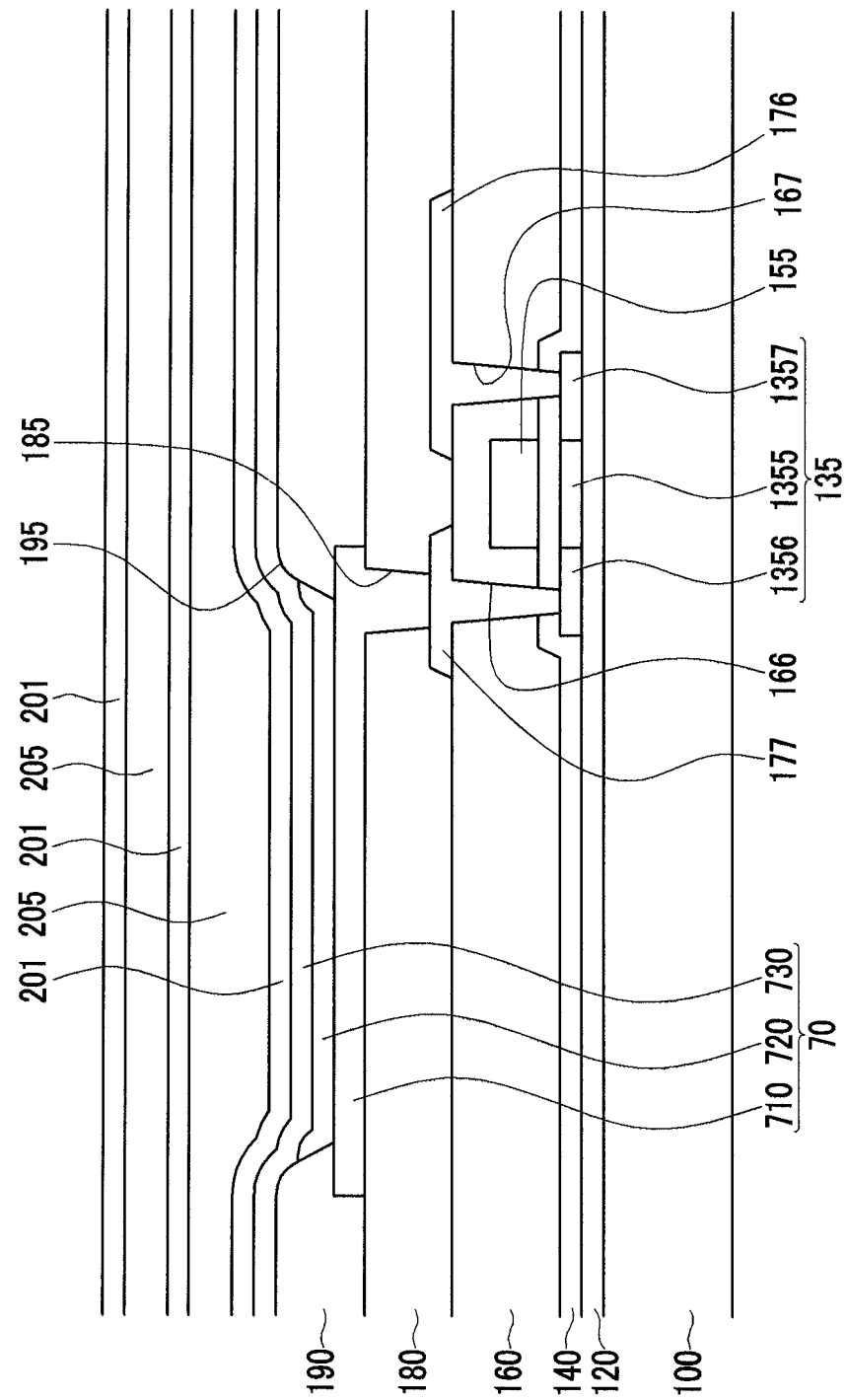
FIG. 9 to FIG. 11 are cross-sectional views depicting a method for manufacturing the OLED display according to an exemplary embodiment of the present invention.
Figure 10:
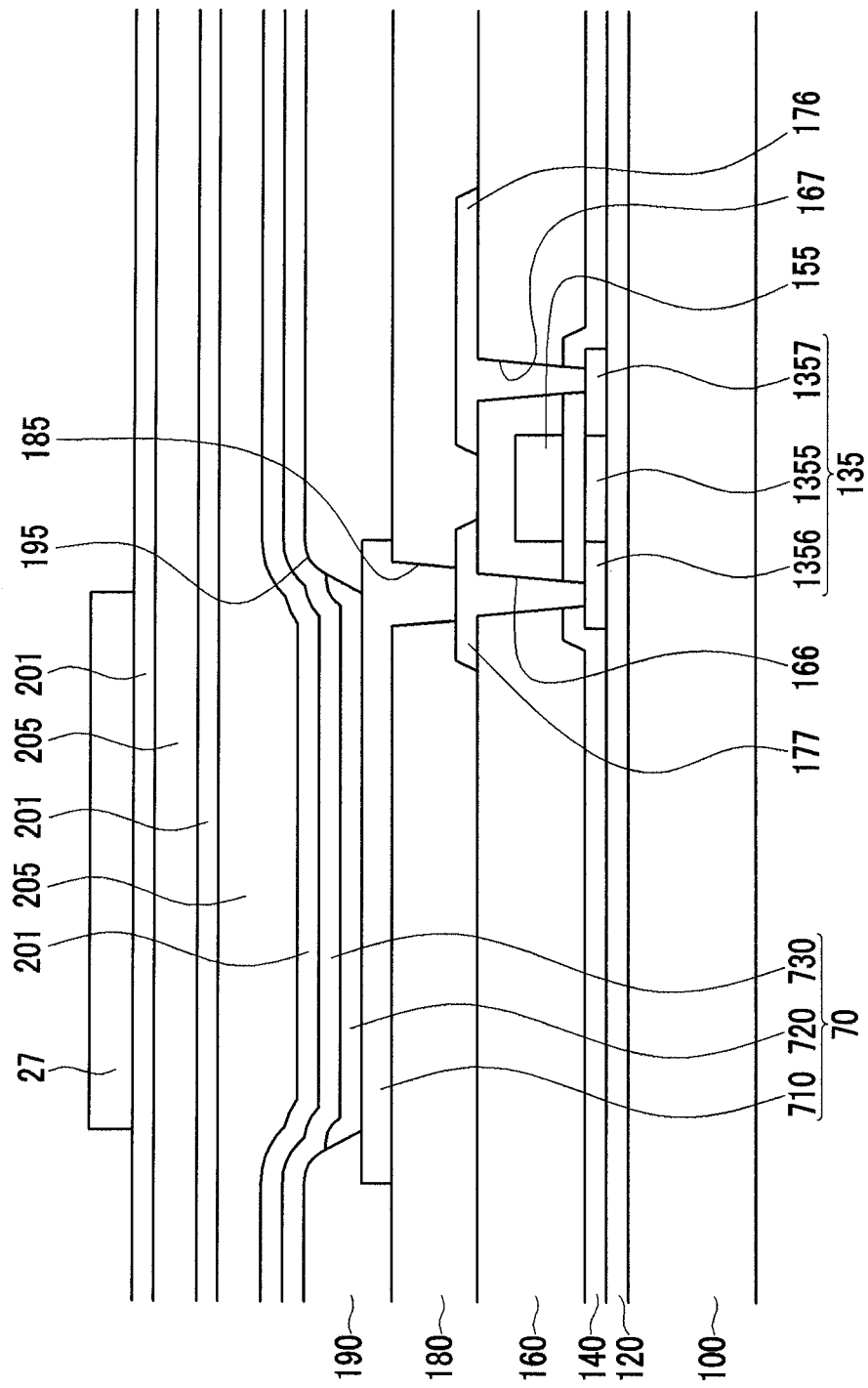
Figure 11:
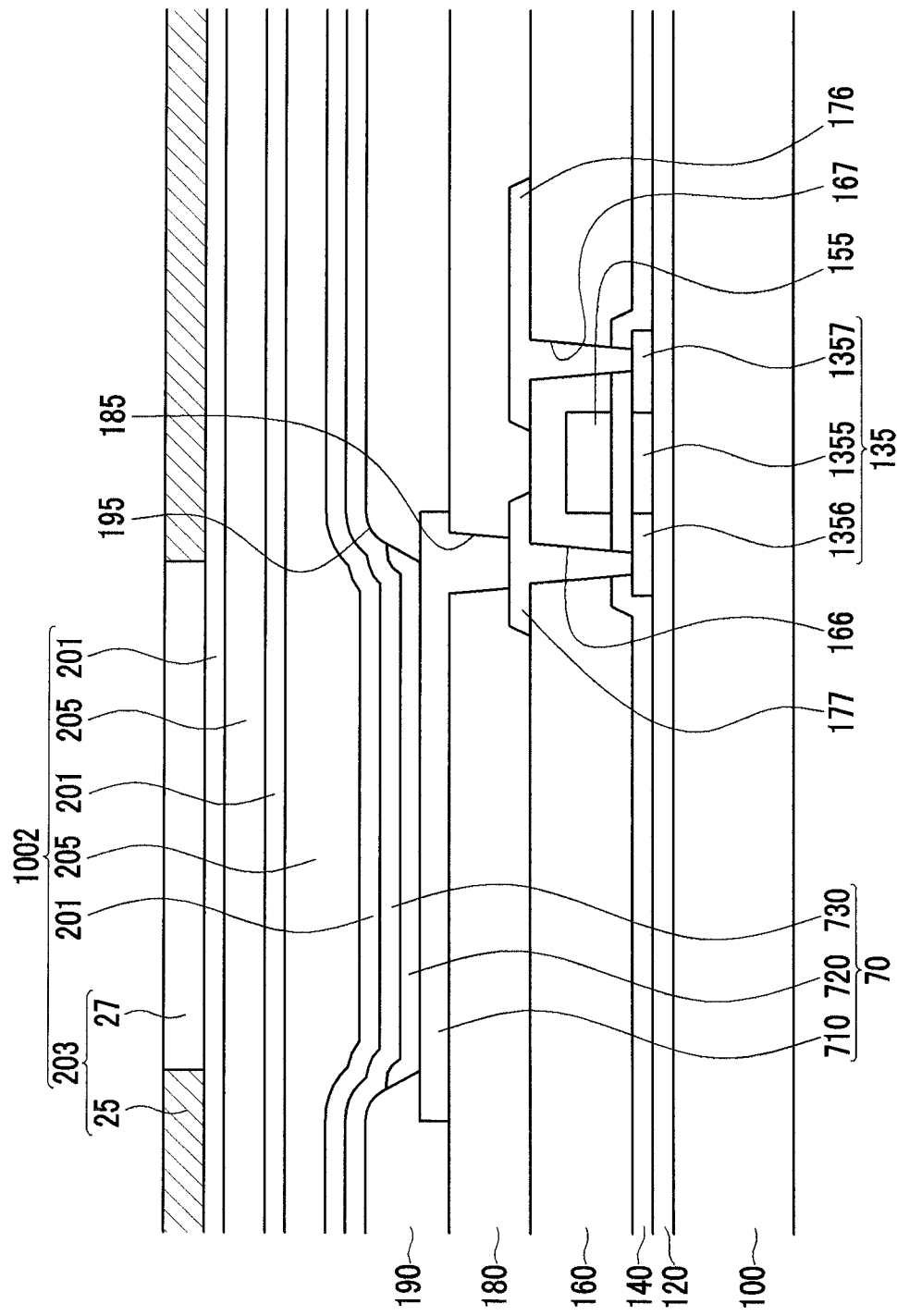

Hereinafter, a method for manufacturing an OLED display according to an exemplary embodiment of the present embodiment will be described with reference to FIG. 9 to FIG. 11. FIG. 9 to FIG. 11 are cross-sectional views that sequentially illustrate a manufacturing method of the OLED display according to an exemplary embodiment of the present invention.

As shown in FIG. 9, the thin film transistor Q2 and the organic light emitting element 70 are formed on the substrate 100. In addition, the inorganic layer 201 and the second organic layer 205 are formed by alternately layering the inorganic layer 201 and the second organic layer 205 on the organic light emitting element 70. The inorganic layer 201 and the second organic layer 205 may be formed by, for example, sputtering, E-beam, CVD, and the like.

Next, as shown in FIG. 10, the light-transmitting unit 27 of the first organic layer 203 is formed on the inorganic layer 201. The light-transmitting unit 27 may be formed of a transparent organic material, and is formed using an inkjet printing method in only a light-emission area that corresponds to the organic emission layer 720.

Then, as shown in FIG. 11, the first organic layer 203 is completed by forming the light-blocking unit 25 on the inorganic layer 201 that corresponds to a non-light-emission area. The light-blocking unit 25 is an organic material including a black pigment, and may be formed using an inkjet printing method, like the light-transmitting unit 27.

Next, as shown in FIG. 6, the reflection-preventing layer 300 is formed on the first organic layer 203, and may be formed by layering the metal layer and the dielectric material layer, and may be formed using sputtering, E-beam, CVD, or flash evaporation, and the like.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. An organic light emitting diode (OLED) display comprising:
   a substrate on which an organic light emitting element is located;
   an inorganic layer and a first organic layer on the substrate and covering the organic light emitting element; and
   a reflection-preventing layer on the first organic layer,
   wherein the first organic layer comprises a light-blocking unit and a light-transmitting unit, and
   the first organic layer is disposed directly on the inorganic layer.

2. The OLED display of claim 1, wherein the substrate comprises:
   a light-emission area where the organic light emitting element is located; and a non-light-emission area comprising an area other than the light-emission area,
wherein the light-blocking unit of the first organic layer corresponds to the non-light-emission area, and
wherein the light-transmitting unit corresponds to the light-emission area.

3. The OLED display of claim 2, wherein the organic light emitting element comprises a first electrode, an organic emission layer, and a second electrode, and
wherein the light-emission area corresponds to the organic emission layer.

4. The OLED display of claim 1, further comprising a plurality of inorganic layers and a plurality of organic layers, wherein the inorganic layers and the organic layers are alternately layered.

5. The OLED display of claim 1, further comprising a second organic layer between the organic light emitting element and the first organic layer,
wherein the light-transmitting unit and the second organic layer are made of a same transparent organic material.

6. The OLED display of claim 1, wherein the reflection-preventing layer comprises a metal layer and a dielectric material layer.

7. The OLED display of claim 6, wherein transmittance of the reflection-preventing layer is about 30% to about 70%.

8. The OLED display of claim 6, wherein the metal layer comprises at least one of chromium (Cr), molybdenum (Mo), titanium (Ti), tungsten (W), or an alloy thereof.

9. The OLED display of claim 6, wherein the dielectric material layer comprises a high refractive index layer and a low refractive index layer,
wherein the high refractive index layer comprises a material having a refractive index of about 1.6 or higher, and
wherein the low refractive index layer comprises a material having a refractive index of less than about 1.6.

10. The OLED display of claim 6, wherein the reflection-preventing layer comprises a first chromium layer, a first silicon oxide layer, a second chromium layer, a titanium oxide layer, and a second silicon oxide layer.

11. The OLED display of claim 1, further comprising:
a transistor on the substrate;
an interlayer insulating layer on the transistor;
a first electrode of the organic light emitting element on the interlayer insulating layer and coupled with the transistor through a contact hole;
a pixel defining layer on the interlayer insulating layer and having an opening that exposes the first electrode;
an organic emission layer of the organic light emitting element in the opening; and
a second electrode of the organic light emitting element on the organic emission layer and the pixel defining layer,
wherein the light-blocking unit has a plane pattern that is the same as that of the pixel defining layer.

* * * * *